(12) United States Patent
Mehta

(10) Patent No.: US 6,524,911 B1
(45) Date of Patent: Feb. 25, 2003

(54) COMBINATION OF BPTEOS OXIDE FILM WITH CMP AND RTA TO ACHIEVE GOOD DATA RETENTION

(75) Inventor: Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 104 days.

(21) Appl. No.: 09/731,184

(22) Filed: Dec. 7, 2000

(51) Int. Cl.[7] .............................. H01L 21/336
(52) U.S. Cl. ................ 438/257; 438/257; 438/261; 438/303; 438/591; 438/263; 438/264; 438/265; 438/266; 438/267; 438/299; 438/305
(58) Field of Search ................ 438/257, 261, 438/263, 264, 265, 266, 267, 299, 305, 303

(56) References Cited

U.S. PATENT DOCUMENTS

| | | | | |
|---|---|---|---|---|
| 4,982,250 A | * | 1/1991 | Manas, II et al. | |
| 5,686,336 A | * | 11/1997 | Lee | |
| 6,033,999 A | * | 3/2000 | Wu et al. | 438/789 |
| 6,284,612 B1 | * | 9/2001 | Wu | 438/305 |

* cited by examiner

*Primary Examiner*—Olik Chaudhuri
*Assistant Examiner*—Khiem Nguyen

(57) ABSTRACT

An improved method of fabricating a non-volatile semiconductor device having a BPTEOS oxide film is provided. The present method utilizes the step of performing a RTA at a temperature of about 800° C. immediately after the deposition of the BPTEOS film so as to densify and stabilize the same. Then, a CMP step is performed so as to planarize the BPTEOS film.

20 Claims, 2 Drawing Sheets

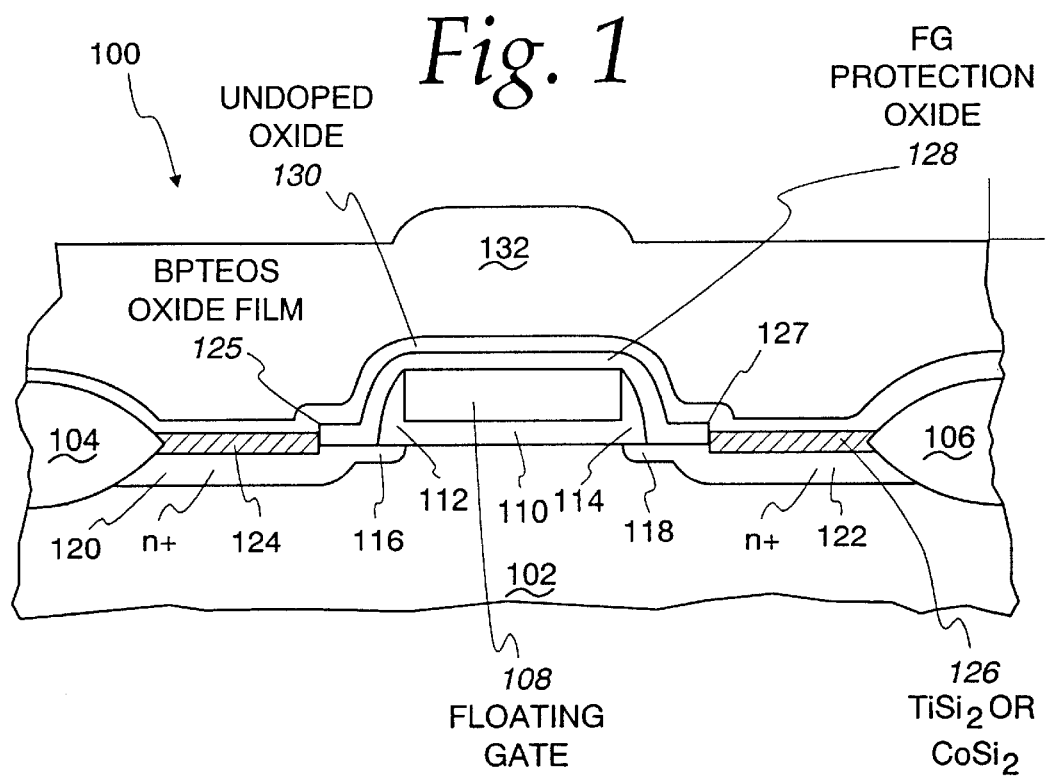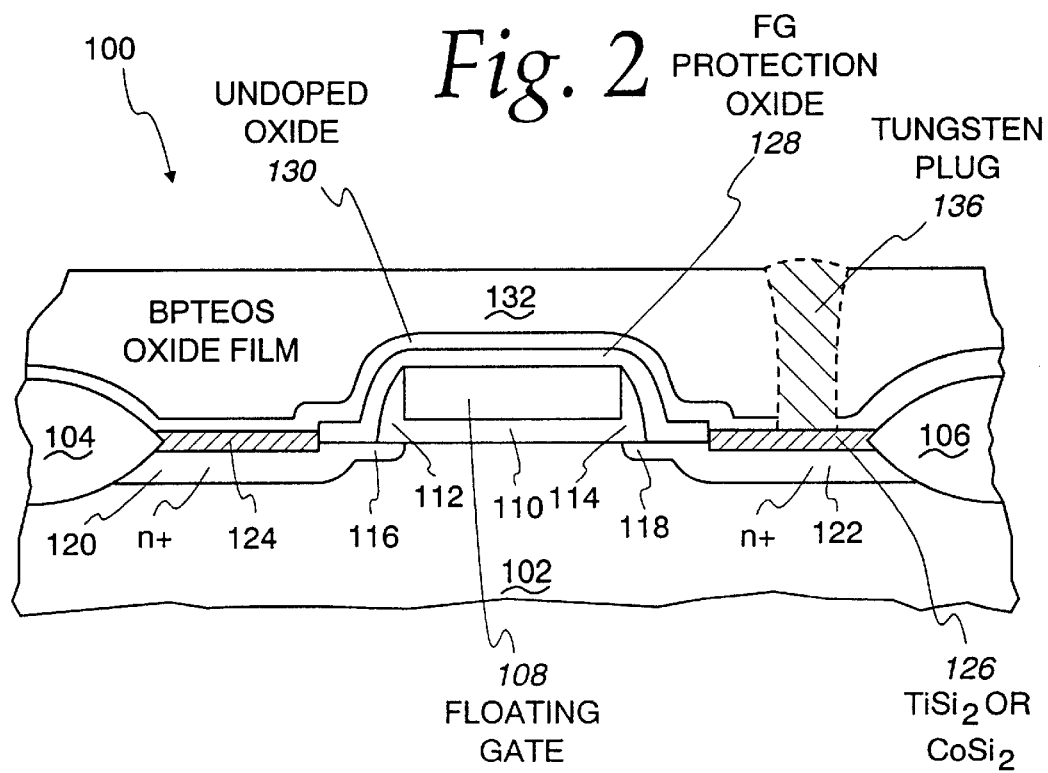

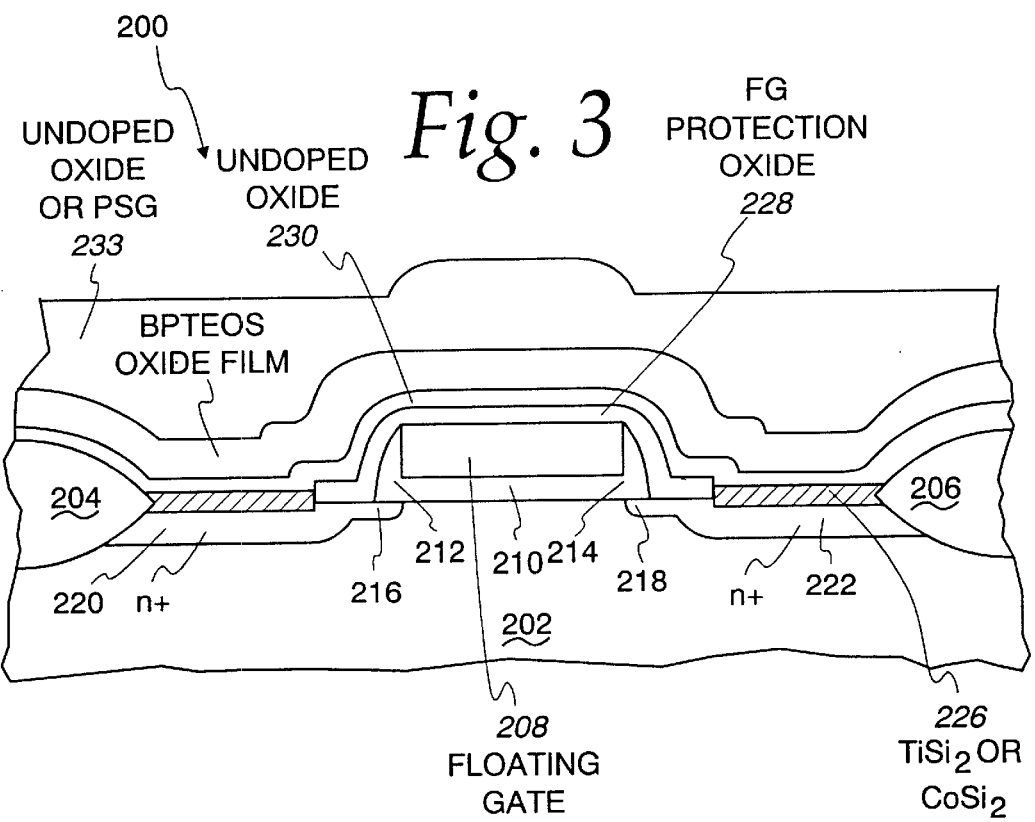
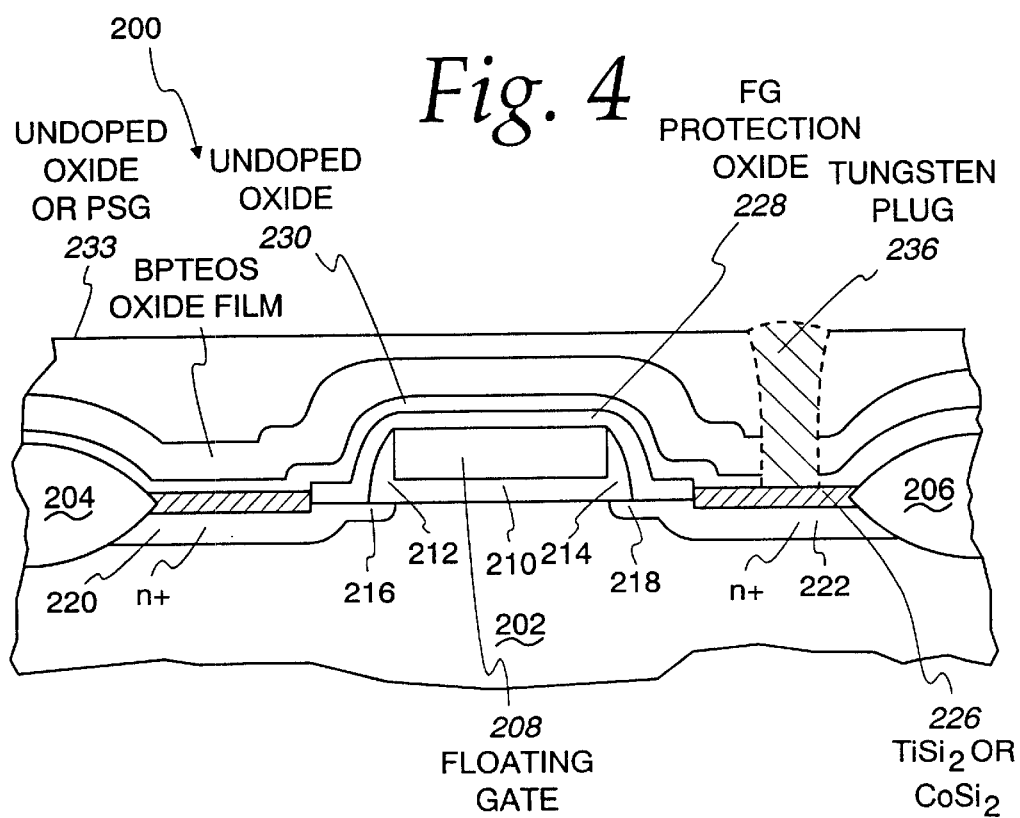

COMBINATION OF BPTEOS OXIDE FILM WITH CMP AND RTA TO ACHIEVE GOOD DATA RETENTION

BACKGROUND OF THE INVENTION

1. Field of the Invention

This invention relates generally to semiconductor processing methods, and more particularly, it relates to a method for manufacturing a non-volatile semiconductor device having a BPTEOS oxide film which is densified and stabilized by RTA followed by CMP so as to achieve good data retention.

2. Description of the Prior Art

In view of the trend in the semiconductor industry for achieving higher and higher packing densities in integrated circuits, multilayer interconnects are being used to connect the electrical components on two different levels. Typically, a BPTEOS layer is used as an interlayer dielectric (ILD) between the two different levels. As is generally known, one of the major concerns in the fabrication of non-volatile memory devices is that of high temperature data retention which is believed to be caused by mobile hydrogen ions. These mobile ions can diffuse to the floating gate in the non-volatile memory devices and cause charge loss.

Traditionally, the prior art semiconductor processing for non-volatile memory devices having BPTEOS oxide films utilized a high temperature heat treatment at equal to or greater than 900° C. for planarization in order to getter mobile ions and thus obtain good data retention. This is sometimes referred to as a "reflow" process. However, the latest metal interconnect technologies involves the use of silicide films, such as a titanium silicide ($TiSi_2$) layer or a cobalt silicide ($CoSi_2$) layer in the semiconductor manufacturing process. Unfortunately, these silicide films are unable to withstand the high furnace reflow temperatures normally used on the BPTEOS oxide films functioning as the interlayer dielectric for densifying and planarizing the same.

Accordingly, there has arisen a need for a method for manufacturing a non-volatile memory device having a BPTEOS oxide film which eliminates the high temperature reflow process, but yet provides for the densification and planarization of the BPTEOS film. This is achieved in the present invention by utilizing the combination of performing a RTA at the temperature of about 800° C. immediately after the deposition of the BPTEOS film so as to densify and stabilize the same and then performing a CMP step so to planarize the BPTEOS film.

SUMMARY OF THE INVENTION

Accordingly, it is a general object of the present invention to provide an improved method for fabricating a non-volatile semiconductor device having a BPTEOS film which overcomes the problems of the prior art methods.

It is an object of the present invention to provide an improved method for fabricating a non-volatile semiconductor device having a BPTEOS film which eliminates the high temperature reflow process, but yet provides for the densification and planarization of the BPTEOS film.

It is another object of the present invention to provide an improved method for fabricating a non-volatile semiconductor device having a BPTEOS film which is densified and stabilized by RTA followed CMP so as to achieve good data retention.

It is still another object to provide an improved method for fabricating a non-volatile semiconductor device having a BPTEOS film which includes the steps of performing a RTA at a temperature of about 800° C. immediately after the deposition of the BPTEOS film so to densify and stabilize the same and then performing a CMP so as to planarize the BPTEOS film.

In accordance with a preferred embodiment of the present invention, there is provided an improved method of fabricating a non-volatile semiconductor device having a BPTEOS oxide film. The present method utilizes the step of performing a RTA at a temperature of about 800° C. immediately after the deposition of the BPTEOS film so as to densify and stabilize the same. Then, a CMP step is performed so as to planarize the BPTEOS film.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a cross-sectional view of a non-volatile semiconductor device manufactured in accordance with the method of the present invention, having a BPTEOS film deposited thereon but before the RTA and CMP process steps;

FIG. 2 is a cross-sectional view similar to FIG. 1, but after the RTA and CMP process steps are performed;

FIG. 3 is a cross-sectional view of a non-volatile semiconductor device manufactured in accordance with the alternate method of the present invention, having a BPTEOS film and an undoped oxide layer deposited thereon but before the RTA and CMP process steps; and FIG. 4 is a cross-sectional view similar to FIG. 3, but after the RTA and CMP process steps are performed.

DESCRIPTION OF THE PREFERRED EMBODIMENT

The purpose of this invention is to provide an improved method for manufacturing a non-volatile semiconductor device having a BPTEOS oxide film which eliminates the need of a high temperature reflow process step typically performed at a temperature of greater than 900° C., but yet provides for the densification and stabilization of the BPTEOS film so as to produce good data retention. In view of this, the inventor of the instant invention has achieved this result by utilizing the combination of performing a RTA at the temperature of about 800° C. immediately after the deposition of the BPTEOS film so as to densify and stabilize the same and then performing a CMP step so to planarize the BPTEOS film. Accordingly, the required modifications to the conventional non-volatile semiconductor device fabrication process are minimal and therefore do not increase significantly the manufacturing costs.

Referring now in detail to the various views of the drawings, there is shown in FIG. 1 a cross-sectional view of a non-volatile semiconductor device 100 manufactured in accordance with the principles of the present invention wherein a BPTEOS layer has been deposited but prior to the performance of RTA and CMP process steps. As can be seen, the semiconductor device 100 includes a semiconductor substrate 102 on which is formed field oxide regions 104 and 106. As is well known in the art, the field oxide regions 104 and 106 may be formed by a LOCOS (local oxidation on silicon) method. In the alternative, a conventional STI (shallow trench isolation) method may be used so as to produce isolation regions in order to separate the active regions on the semiconductor substrate 102.

The semiconductor device 100 further includes a floating gate 108 such as a polysilicon gate formed on top of gate oxide layer 110 overlying the semiconductor substrate 102. Sidewall spacers 112 and 114 are formed on each side of the floating gate 108. Prior to the formation of the sidewall spacers 112 and 114, lightly-doped drain (LDD) regions 116 and 118 are formed in the semiconductor substrate 102. An n+source region 120 and an n+drain region 122 are thereafter formed in the semiconductor substrate 102.

An optional floating gate protection layer 128 is formed over the floating gate 108 and consists of a "getter" layer which serves to trap free hydrogen ions that are released during use of the semiconductor device and to protect underlying areas from forming silicide layers in subsequent processing steps. The hydrogen getter layer 128 may be a PSG (phospho-silicate glass) film, a BPGS (borophosphosilicate glass) film, a PTEOS (phosphorus-doped tetraethylorthosilicate) deposited oxide film, or a BPTEOS (borophosphorus-doped tetraethylorthosilicate) deposited oxide film. The thickness of the layer 128 is in the range of 500 < to 2000 Å and is preferably 1000 Å. Further, the getter layer 128 is etched at areas 125 and 127 so as to allow a salicide layer to form in the areas not protected by the hydrogen getter layer.

A source salicide layer 124 is formed on the top surface of the source region 120, and a drain salicide layer 126 is formed on the top surface of the drain region 122. The salicide layers 124 and 126 are preferably formed of titanium silicide ($TiSi_2$) or cobalt silicide ($CoSi_2$), as is well to those skilled in the art of semiconductor manufacturing.

After the formation of the salicide layers, an undoped oxide layer 130 on top of the getter layer 128 over the entire surface of the semiconductor device 100. The thickness of the undoped oxide layer 130 is about 250 Å. Then, an interlayer dielectric 132 is deposited on top of the undoped oxide layer 130 over the entire surface of the semiconductor device. The interlayer dielectric is preferably formed of a BPTEOS (borophosphorus-doped tetraethylorthosilicate) deposited oxide film. The thickness of the layer 132 is on the order of 12,000 Å or greater. In the conventional fabrication process, a high temperature reflow process, typically at a temperature of 900° C. or above, would now be performed in order to planarize the BPTEOS film. However, the salicide layers 124 and 126 cannot withstand the high temperatures used normally in the conventional furnace reflow type heater for the BPTEOS film.

In view of this, the inventor of the present invention developed a way of eliminating this reflow process by using a rapid thermal annealing (RTA) step at a temperature of about 800° C. for a duration of approximately 1 minute which is performed immediately after the deposition of the BPTEOS film so as to densify and stabilize the same. Next, after the RTA step the BPTEOS film is planarized to a final thickness of about 8000 Å by using a chemical-mechanical polishing (CMP) step. This resultant semiconductor structure is illustrated in FIG. 2.

After the polishing step, as is shown in the dotted lines of FIG. 2 a conventional electrical contact is formed by subsequent processing of the semiconductor structure. In particular, the BPTEOS layer 132 is etched so as to create a channel 134 therein so as to expose the drain salicide layer 126. Thereafter, the channel 134 is filled with a tungsten plug 136 utilizing a conventional CVD process for producing an electrical interconnection between the drain salicide layer 126 and selected portion of any component formed above the BPTEOS layer 132 of the semiconductor device 100.

In a second alternate embodiment of the instant invention as depicted in FIG. 3, a semiconductor device 200 includes a semiconductor substrate 202 on which is formed field oxide regions 204 and 206. As is well known in the art, the field oxide regions 204 and 206 may be formed by a LOCOS (local oxidation on silicon) method. In the alternative, a conventional STI (shallow trench isolation) method may be used so as to produce isolation regions in order to separate the active regions on the semiconductor substrate 202.

The semiconductor device 200 further includes a floating gate 208 such as a polysilicon gate formed on top of gate oxide layer 210 overlying the semiconductor substrate 202. Sidewall spacers 212 and 214 are formed on each side of the floating gate 208. Prior to the formation of the sidewall spacers 212 and 214, lightly-doped drain (LDD) regions 216 and 218 are formed in the semiconductor substrate 202. An n+ source region 220 and an n+drain region 222 are thereafter formed in the semiconductor substrate 202.

An optional floating gate protection layer 228 is formed over the floating gate 208 and consists of a "getter" layer which serves to trap free hydrogen ions that are released during use of the semiconductor device and to protect underlying areas from forming salicide layers in subsequent processing steps. The hydrogen getter layer 228 may be a PSG (phospho-silicate glass)film, a BPGS (borophosphosilicate glass) film, a PTEOS (phosphorus-doped tetraethylorthosilicate)deposited oxide film, or a BPTEOS (borophosphorus-doped tetraethylorthosilicate) deposited oxide film. The thickness of the layer 228 is in the range of 500Å to 2000 Å and is preferably 1000 Å. Further, the getter layer 228 is etched at areas 225 and 227 so as to allow a salicide layer to form in the areas not protected by the hydrogen getter layer.

A source salicide layer 224 is formed on the top surface of the source region 220, and a drain salicide layer 226 is formed on the top surface of the drain region 222. The salicide layers 224 and 226 are preferably formed of titanium silicide ($TiSi_2$) or cobalt silicide ($CoSi_2$), as is well to those skilled in the art of semiconductor manufacturing.

After the formation of the salicide layers, an undoped oxide layer 230 on top of the getter layer 228 over the entire surface of the semiconductor device 200. The thickness of the undoped oxide layer 230 is about 250 Å. Then, an interlayer dielectric 232 is deposited on top of the undoped oxide layer 230 over the entire surface of the semiconductor device. The interlayer dielectric is preferably formed of a BPTEOS (borophosphorus-doped tetraethylorthosilicate) deposited oxide film. The layer 232 has a minimum thickness of 3000 Å. Next, a rapid thermal annealing (RTA) step at a temperature of about 800° C. for a duration of approximately 1 minute is performed immediately after the deposition of the BPTEOS film so as to densify and stabilize the same. Next, after the RTA step an undoped oxide layer of PSG layer 233 is deposited on top of the BPTEOS film over the entire surface of the semiconductor device. The thickness of the layer 233 is approximately 9000 Å or more. Finally, the undoped oxide or PSG layer 233 is planarized to a final thickness of about 8000 Å by using a chemical-mechanical polishing (CMP) step. This resultant semiconductor structure is illustrated in FIG. 4.

After the polishing step, as is shown in the dotted lines of FIG. 4 a conventional electrical contact is formed by subsequent processing of the semiconductor structure. In particular, the undoped oxide or PSG layer 233 is etched so as to create a channel 234 therein so as to expose the drain salicide layer 226. Thereafter, the channel 234 is filled with a tungsten plug 236 utilizing a conventional CVD process for producing an electrical interconnection between the drain salicide layer 226 and selected portion of any component formed above the undoped oxide or PSG layer 233 of the semiconductor device 200.

From the foregoing detailed description, it can thus be seen that the present invention provides an improved method for fabricating a non-volatile semiconductor device having a BPTEOS oxide film. The present method utilizes the step of performing a RTA at a temperature of about 800° C. immediately after the deposition of the BPTEOS film so as to densify and stabilize the same. Then, a CMP step is performed so as to planarize the BPTEOS film.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of fabricating a non-volatile semiconductor device, comprising the steps of:
    forming a gate oxide on a semiconductor substrate;
    forming a floating gate on top of the gate oxide;
    forming sidewall spacers on each side of the floating gate;
    forming source/drain regions on opposite sides of the sidewall spacers in the semiconductors substrate;
    forming a salicide layer on top of the source/drain regions;
    depositing an updoped oxide layer over the entire surface of the semiconductor device;
    depositing a BPTEOS oxide film on top of the undoped oxide layer over the entire surface of the semiconductor device;
    annealing the BPTEOS film at a temperature of about 800° C. so as to densify and stabilize the BPTEOS film; and
    chemical-mechanical polishing of the BPTEOS film so as to planarize the same;
    wherein the BPTEOS film is deposited on top of the undoped oxide layer to a thickness of about 12000 Å;
    and wherein the step of the chemical-mechanical polishing causes the BPTEOS to be planarized to final thickness of about 8000 Å.

2. A method of fabricating a non-volatile semiconductor device as claimed in claim 1, further comprising the step of forming a channel in the BPTEOS film after it has been planarized so as to expose the salicide layer overlying one of the source/drain regions and filling the channel with a tungsten plug so as to define an electrical contact.

3. A method of fabricating a non-volatile semiconductor device as claimed in claim 1, further comprising the step of forming a floating gate protection layer over the floating gate subsequent to the formation of the source/drain regions.

4. A method of fabricating a non-volatile semi-conductor device, comprising the steps of:
    forming a gate oxide on a semiconductor substrate;
    forming a floating gate on top of the gate oxide;
    forming sidewall spacers on each side of the floating gate;
    forming source/drain regions on opposite sides of the sidewall spacers in the semiconductor substrate;
    forming a salicide layer on top of the source/drain regions;
    depositing a first undoped oxide layer over the entire surface of the semiconductor device;
    depositing a BPTEOS oxide film on top of the undoped oxide layer over the entire surface of the semiconductor device;
    annealing the BPTEOS film at a temperature of about 800° C. so as to densify and stabilize the BPTEOS film;
    depositing a second undoped oxide or PSG layer on top of the BPTEOS oxide film after annealing; and
    chemical-mechanical polishing of the second undoped oxide or PSG layer so as to planarize the same.

5. A method of fabricating a non-volatile semi-conductor device as claimed in claim 4, wherein the BPTEOS film is deposited on top of the first undoped oxide layer to a thickness of at least 3000 Å.

6. A method of fabricating a non-volatile semi-conductor device as claimed in claim 5, wherein the second undoped oxide or PSG layer is deposited on top of the BPTEOS film has a thickness of about 9000 Å.

7. A method of fabricating a non-volatile semi-conductor device as claimed in claim 6, wherein the step of chemical-mechanical polishing causes the second undoped oxide or PSG layer to be planarized to final thickness of about 8000 Å.

8. A method of fabricating a non-volatile semi-conductor device as claimed in claim 4, further comprising the step of forming a channel in the second undoped oxide or PSG layer after it has been planarized so to expose the silicide layer overlying one of the source/drain regions and filling the channel with a tungsten plug so as to define an electrical contact.

9. A method of fabricating a non-volatile semi-conductor device as claimed in claim 4, further comprising the step of forming a floating gate protection layer over the floating gate subsequent to the formation of the source/drain regions.

10. A method of fabricating a non-volatile semiconductor device, comprising the steps of:
    forming a salicide layer in the semiconductor substrate;
    depositing a BPTEOS oxide film overlying the salicide layer over the entire surface of the semiconductor device;
    annealing the BPTEOS film at a temperature of about 800° C. so as to densify and stabilize the BPTEOS film;
    chemical-mechanical polishing of the BPTEOS film so as to planarize the same; and
    forming a channel in the BPTEOS film after it has been planarized so as to expose the salicide layer and filling the channel with a tungsten plug so as to define an electrical contact.

11. A method of fabricating a non-volatile semiconductor device as claimed in claim 10, wherein the BPTEOS film is deposited to a thickness of about 12000 Å.

12. A method of fabricating a non-volatile semiconductor device as claimed in claim 10, wherein the step of chemical-mechanical polishing causes the BPTEOS film to be planarized to final thickness of about 8000 Å.

13. A method of fabricating a non-volatile semiconductor device, comprising:

forming a tunnel dielectric on a semiconductor substrate and forming a floating gate on top of the tunnel dielectric, wherein said floating gate is electrically isolated to retain charge stored thereon;

forming source and drain regions to sides of said tunnel dielectric and said floating gate, and forming a salicide layer with said source and drain regions;

depositing a BPTEOS oxide film over the entire surface of the semiconductor device; and preventing degradation of said salicide layer on top of the source/drain regions by annealing the BPTEOS film at a relatively low temperature of less than about 850° C. after formation of said salicide layer on top of the source/drain regions, wherein said annealing densifies and stabilizes the BPTEOS film.

14. The method of claim 13, further comprising:

chemical-mechanical polishing of the BPTEOS film so as to planarize the same.

15. The method of claim 14, wherein the BPTEOS film is deposited to a thickness of about 12000 Å, and wherein the step of chemical-mechanical polishing causes the BPTEOS to be planarized to final thickness of about 8000 Å.

16. The method of claim 13, further comprising:

depositing an undoped oxide layer over the entire surface of the semiconductor device before depositing said BPTEOS oxide film on top of said undoped oxide layer.

17. The method of claim 13, further comprising:

forming sidewall spacers on each side of the tunnel dielectric and the floating gate, and forming said source/drain regions on opposite sides of the sidewall spacers in the semiconductor substrate.

18. The method of claim 13, wherein the BPTEOS film is deposited to a thickness of about 12000 Å.

19. The method of claim 13, further comprising:

forming a channel in the BPTEOS film after it has been planarized so as to expose the salicide layer overlying one of the source/drain regions and filling the channel with a tungsten plug so as to define an electrical contact.

20. The method of claim 13, further comprising:

forming a floating gate protection layer over the floating gate subsequent to the formation of the source/drain regions.

* * * * *